United States Patent
Yamaguchi et al.

(10) Patent No.: US 8,822,307 B2
(45) Date of Patent: Sep. 2, 2014

(54) SEMICONDUCTOR MANUFACTURING APPARATUS AND SEMICONDUCTOR MANUFACTURING METHOD

(75) Inventors: Naoko Yamaguchi, Kanagawa (JP); Kazumasa Tanida, Oita (JP); Hideo Numata, Oita (JP); Satoshi Hongo, Oita (JP); Kenji Takahashi, Ibaraki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 13/422,966

(22) Filed: Mar. 16, 2012

(65) Prior Publication Data

US 2012/0329241 A1   Dec. 27, 2012

(30) Foreign Application Priority Data

Jun. 27, 2011   (JP) .................................. 2011-141979

(51) Int. Cl.
  *H01L 21/762*   (2006.01)
  *B32B 37/10*    (2006.01)
  *B32B 38/18*    (2006.01)
  *H01L 21/67*    (2006.01)

(52) U.S. Cl.
  CPC .... *H01L 21/76251* (2013.01); *H01L 21/67092* (2013.01)
  USPC ..... 438/455; 156/358; 156/556; 257/E21.567

(58) Field of Classification Search
  CPC ............ H01L 21/76251; H01L 21/187; H01L 21/67092; B32B 37/00
  USPC ........................................... 156/60; 438/455
  See application file for complete search history.

(56) References Cited

U.S. PATENT DOCUMENTS

| 4,636,275 | A  | * | 1/1987  | Norell ........................... 156/289 |
| 5,523,254 | A  | * | 6/1996  | Satoh et al. .................... 438/457 |
| 5,640,303 | A  | * | 6/1997  | Hooley .......................... 361/699 |
| 5,769,991 | A  | * | 6/1998  | Miyazawa et al. ............ 156/153 |
| 5,980,368 | A  | * | 11/1999 | Chang et al. ................... 451/303 |
| 6,008,113 | A  | * | 12/1999 | Ismail et al. ................... 438/615 |
| 6,451,670 | B1 | * | 9/2002  | Takisawa et al. .............. 438/457 |
| 6,468,098 | B1 | * | 10/2002 | Eldridge ........................ 439/197 |
| 7,037,804 | B2 | * | 5/2006  | Kellar et al. ................... 438/455 |
| 2001/0044269 | A1 | * | 11/2001 | Carpenter ..................... 451/287 |
| 2008/0285059 | A1 | * | 11/2008 | Gabriel et al. ................ 356/623 |
| 2009/0197053 | A1 | * | 8/2009  | Sokolov et al. ............ 428/195.1 |
| 2010/0122762 | A1 | * | 5/2010  | George ............................ 156/64 |
| 2011/0000612 | A1 | * | 1/2011  | Gaudin et al. ................. 156/285 |
| 2011/0217795 | A1 |   | 9/2011  | Tanida et al. |
| 2011/0304003 | A1 |   | 12/2011 | Tanida et al. |
| 2012/0049312 | A1 |   | 3/2012  | Tanida et al. |
| 2013/0105061 | A1 | * | 5/2013  | Castex et al. .................... 156/60 |

FOREIGN PATENT DOCUMENTS

| JP | 2-135722 | 5/1990 |
| JP | 3-55822  | 3/1991 |

(Continued)

*Primary Examiner* — Charles Garber
*Assistant Examiner* — Alia Sabur
(74) *Attorney, Agent, or Firm* — Oblon, Spivak, McClelland, Maier & Neustadt, L.L.P.

(57) ABSTRACT

According to one embodiment, a semiconductor manufacturing apparatus is provided. The semiconductor manufacturing apparatus includes a stage, a substrate supporter, first and second pushers, and a controller. The stage is configured to support outer periphery portions of the first semiconductor substrate from below. The substrate supporter is configured to hold the back of the second semiconductor substrate. The first and second pushers are configured to bring the first and second semiconductor substrates in contact. The controller is configured to form the bonding initiation point between the first and second semiconductor substrates.

10 Claims, 9 Drawing Sheets

(56) References Cited

FOREIGN PATENT DOCUMENTS

| JP | 4-3908 | 1/1992 |
| JP | 2000-82642 | 3/2000 |
| JP | 3160936 | 2/2001 |
| JP | 2006-114847 | 4/2006 |

* cited by examiner

SEMICONDUCTOR MANUFACTURING APPARATUS AND SEMICONDUCTOR MANUFACTURING METHOD

CROSS-REFERENCE TO RELATED APPLICATIONS

This application is based upon and claims the benefit of priority from Japanese Patent Application No. 2011-141979, filed on Jun. 27, 2011; the entire contents of which are incorporated herein by reference.

FIELD

Embodiments described herein relate generally to a semiconductor manufacturing apparatus and a semiconductor manufacturing method.

BACKGROUND

In a production process of a Back Side Illumination (BSI) CMOS image sensor, a device wafer, which includes a semiconductor layer including a light receiving sensor (photodiode) and a wiring layer on a surface of a silicon substrate, and a supporting substrate are bonded together. After the bonding, a silicon portion of the device wafer side is removed to expose the light receiving sensor portion of the semiconductor layer. Then the wiring layer, a color filter, and the like are formed on the semiconductor layer.

The process for bonding the device wafer and the supporting substrate includes a direct bonding method at room temperature (ordinary temperature) under atmospheric pressure as one of methods to bond wafer surfaces without adhesive or the like. The direct bonding method is, for example, used for manufacturing a wafer of SOI (Silicon On Insulator) structure, microelectronics products, sensors, MEMS (MicroElectroMechanical System), optical services, and three-dimensional integration.

The direct bonding method locates two wafers with surfaces, on which physical and chemical treatments are performed, facing each other and applies pressure to a part of wafers to bring the surfaces in contact with each other. This causes hydrogen bonding between a hydroxyl group and adsorbed water molecules on the surface of the two wafers. This bonding propagates from the contacted part and finally bonds the whole wafers. When the bonded wafers where the whole wafers are completely bonded are heated with a temperature of equal to or more than 200 to 400° C., this changes at least a part of the hydrogen bonding into a covalent bond such as Si—O—Si bond. This increases the bonding strength between the bonded wafers.

In the case where the direct bonding method is used to bond wafers, the device wafer including the semiconductor layer is often warped in the whole wafer by, for example, thermal stress caused by a difference in coefficient of linear expansion in a multi-layer structure. Thus the device wafer is generally sucked to the stage to correct the warp.

However, the sucked wafer to the stage undergoes a local elastic distortion. When bonding the two wafers in the state where one wafer is sucked to the stage, the local elastic distortion causes a non-uniform stress in the surfaces of the bonded wafers. This leads to expansion and contraction in the bonded wafers. Even in the case where the warped wafer is not sucked to the stage, the elastic distortion of the wafer occurs when applying the pressure. This causes a non-uniform stress in the surface of the bonded wafers. This leads to expansion and contraction in the bonded wafers. Additionally, temperature distribution within the wafer surface causes a difference in thermal stress of the surface of the device wafer. This makes the stress difference of the surface of the bonded wafer more non-uniform. Additionally, a problem arises in that removing the silicon portion of the device wafer side from the bonded wafer causes a further distortion of a device layer especially in a direction along the wafer surface in accordance with the supporting substrate.

DETAILED DESCRIPTION

In general, according to one embodiment, semiconductor manufacturing apparatus and semiconductor manufacturing method include a semiconductor manufacturing apparatus for bonding a first semiconductor substrate and a second semiconductor substrate. The bonding is formed by propagating a bond front from a bonding initiation point to the periphery. The bonding initiation point is formed by bringing bonding surfaces of the first and second semiconductor substrates in contact at a single point. The semiconductor manufacturing apparatus according to the embodiments includes a stage, a substrate supporter, first and second pushers, and a controller. The stage is configured to support outer periphery portions of the first semiconductor substrate from below. The substrate supporter is configured to hold the back of the second semiconductor substrate such that the bonding surface of the second semiconductor substrate faces to the bonding surface of the first semiconductor substrate supported by the stage. The first and second pushers are configured to bring the first and second semiconductor substrates in contact at a single point. The first and second pushers are coaxially disposed with respect to a normal direction of the opposed bonding surfaces. The first and second pushers sandwich the first and second semiconductor substrates and are disposed movably along the normal direction. The controller is configured to form the bonding initiation point between the first and second semiconductor substrates. The bonding initiation point is formed by pressing a single point of an opposite side of the bonding surface with respect to the second semiconductor substrate with the second pusher. The second pusher presses with a pressure without causing a distortion of the second semiconductor substrate.

Exemplary embodiments of semiconductor manufacturing apparatus and semiconductor manufacturing method will be explained below in detail with reference to the accompanying drawings. The present invention is not limited to the following embodiments.

First Embodiment

Figure 1A:
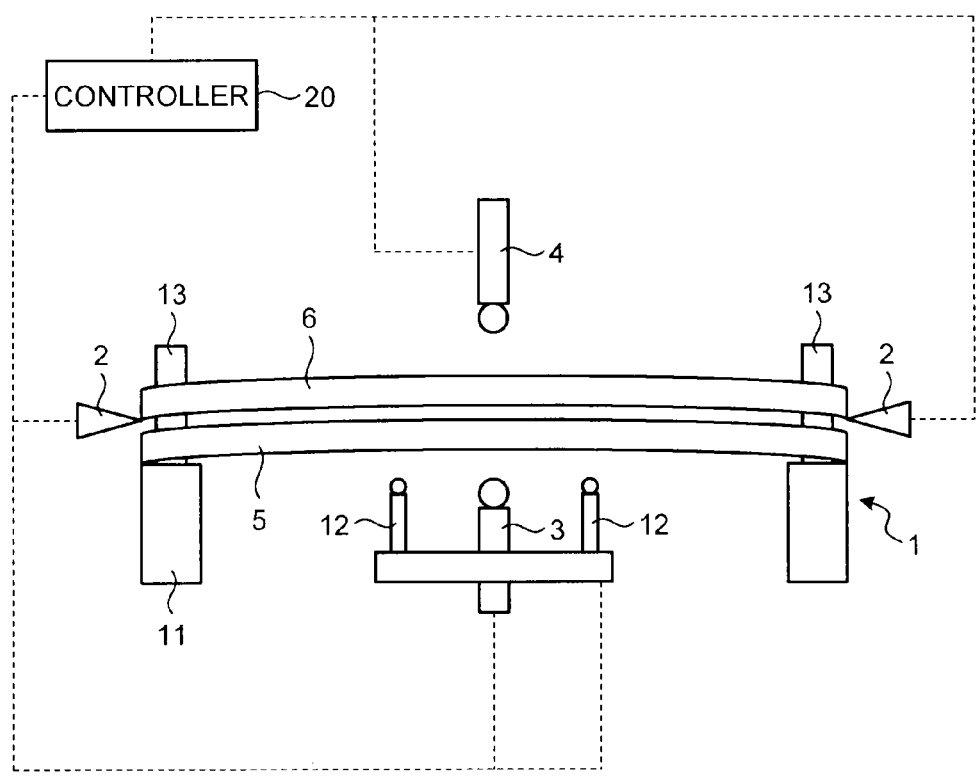
FIG. 1A is a schematic cross-sectional view schematically illustrating a configuration of a semiconductor manufacturing apparatus according to a first embodiment.
Figure 1B:
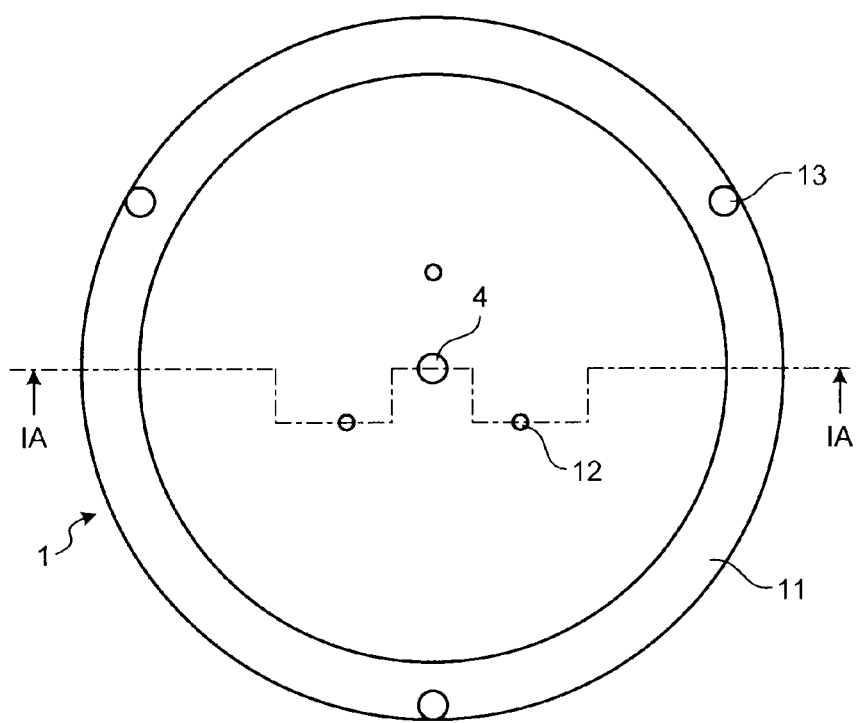
FIG. 1B is a top view schematically illustrating the configuration of the semiconductor manufacturing apparatus according to the first embodiment.

FIG. 1A and FIG. 1B are views schematically illustrating a configuration of a semiconductor manufacturing apparatus according to a first embodiment. FIG. 1A is the schematic cross-sectional view of the semiconductor manufacturing apparatus. FIG. 1B is the top view of the semiconductor manufacturing apparatus. FIG. 1A illustrates the cross-sectional surface taken along a line IA-IA in FIG. 1B. The semiconductor manufacturing apparatus according to this embodiment includes a stage 1, spacers 2, a lower pusher 3, an upper pusher 4, and a controller 20.

The stage 1 has a cylindrical or circular shape, which includes outer periphery portions 11. The stage 1 supports a placed wafer (first semiconductor substrate) 5 in contact with outer periphery portions of the wafer 5 alone. The wafer placed on the stage 1 will be hereinafter referred to as a "lower wafer". The lower wafer 5 is placed on the outer periphery portions 11 as follows. For example, as illustrated in FIG. 1A, the stage 1 includes pusher pins 12 configured to project above the outer periphery portions 11 and guide pins 13 in contact with the outer periphery of the lower wafer 5. The lower wafer 5 is placed on the stage 1 in a state where the pusher pins 12 project above the outer periphery portions 11. Then the pusher pins 12 move down. This ensures that the lower wafer 5 moves down being guided by the guide pins 13 and is placed at a predetermined position. The pusher pin 12 and the guide pin 13 are not essential elements. The lower wafer 5 may be directly placed on the outer periphery portions 11 without the pusher pin 12.

The spacer (substrate supporter) 2 is a member that supports and holds outer periphery portions of a wafer (second semiconductor substrate) 6, which is to be bonded with the lower wafer 5, at a plurality of areas from the lower side of the upper wafer 6. The wafer to be bonded with the lower wafer 5 will be hereinafter referred to as an "upper wafer". The spacer 2 is movable in the vertical direction and adjusts a distance between the upper wafer 6 and the lower wafer 5. The spacer 2 is also movable in a radial direction of the upper wafer 6 and is retractable from between the upper wafer 6 and the lower wafer 5 after the start of bonding.

The lower pusher (first pusher) 3 and the upper pusher (second pusher) 4 are axisymmetrically disposed with respect to a normal direction of a wafer surface. The lower pusher 3 and the upper pusher 4 are each independently movable in the normal direction of the wafer.

The controller 20 is a device that controls movement of the spacers 2, the lower pusher 3, and the upper pusher 4.

FIG. 2A to FIG. 2D are schematic cross-sectional views illustrating a process flow of a direct bonding method using the semiconductor manufacturing apparatus according to this embodiment. When the semiconductor manufacturing apparatus according to this embodiment bonds two wafers, the controller 20 locates the upper wafer 6, which is held by the spacers 2, above the lower wafer 5 placed on the stage 1 such that a bonding surface of the upper wafer 6 faces the lower wafer 5. The controller 20 locates the lower pusher 3 below the lower wafer 5 and the upper pusher 4 above the upper wafer 6 (see FIG. 2A). At this time, the lower pusher 3 and the upper pusher 4 are coaxially located with respect to the normal direction of the lower wafer 5 and the upper wafer 6. The lower pusher 3 and the upper pusher 4 are not necessarily disposed at the center of the wafer. Using the wafer with a larger warp as the lower wafer 5 among two wafers to be bonded together ensures a reduction in a local distortion of the wafer surface as described later. Although the controller 20 retracts the spacers 2 after the lower wafer 5 is overlapped with the upper wafer 6, an air layer between the wafers supports the upper wafer 6. This prevents the upper wafer 6 from contacting the lower wafer 5 at this point.

Figure 2A:
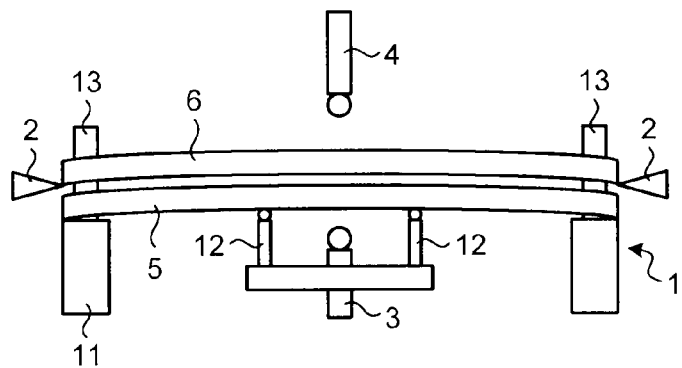
FIG. 2A to FIG. 2D are schematic cross-sectional views illustrating a process flow of a direct bonding method using the semiconductor manufacturing apparatus according to this embodiment.
Figure 2B:
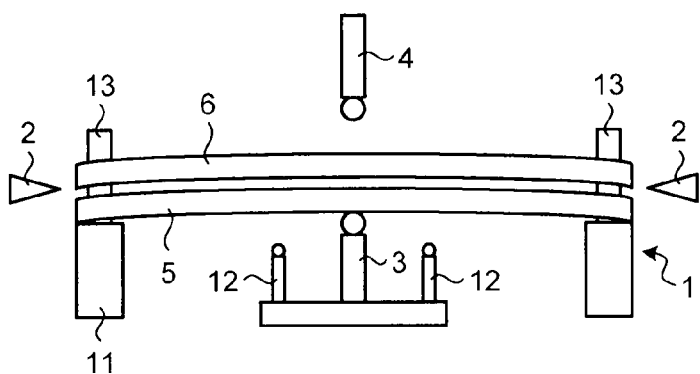
Figure 2C:
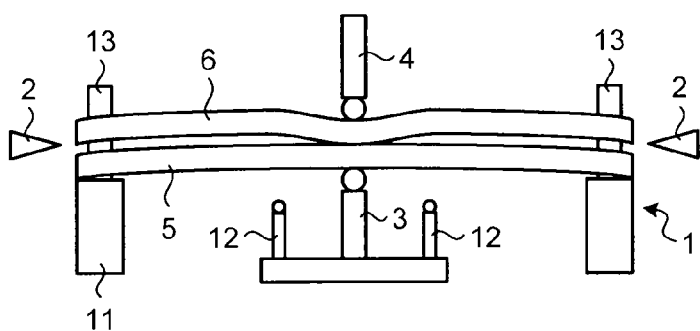
Figure 2D:
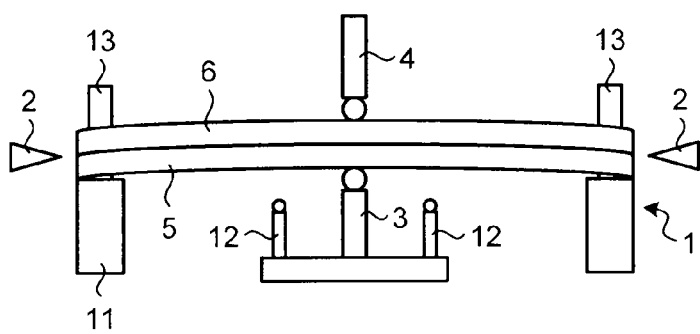

After completion of locating the lower wafer 5, the upper wafer 6, the lower pusher 3, and the upper pusher 4, the controller 20 firstly moves the lower pusher 3 as high as the backside surface of the lower wafer 5 (see FIG. 2B). At this time, the lower wafer 5 does not receive a force from the lower pusher 3 and is not distorted except for deformation under its own weight. Next, the controller 20 moves the upper pusher 4 from the opposite direction toward the upper wafer 6 and applies a pressure, which does not cause a distortion of the upper wafer 6, to the backside surface of the upper wafer 6 (see FIG. 2C). This propagates the bonding front from a bonding initiation point that is sandwiched by the lower pusher 3 and the upper pusher 4, thus bonding all the surfaces of the lower wafer 5 and the upper wafer 6 (see FIG. 2D). This process allows to bond the lower wafer 5 and the upper wafer 6 together without causing a local elastic distortion of the wafer surface. When controlling operations of the lower pusher 3 and the upper pusher 4 to respectively contact the lower wafer 5 and the upper wafer 6, the controller 20 may control the operations by detecting positions of the backside surfaces (opposite sides of respective bonding surfaces) of the lower wafer 5 and the upper wafer 6. The detection may use a method such as a contact sensing method using a pusher with a pressure sensor and a non-contact position sensing method using a laser displacement meter or a current-type microdisplacement meter.

Figure 3:
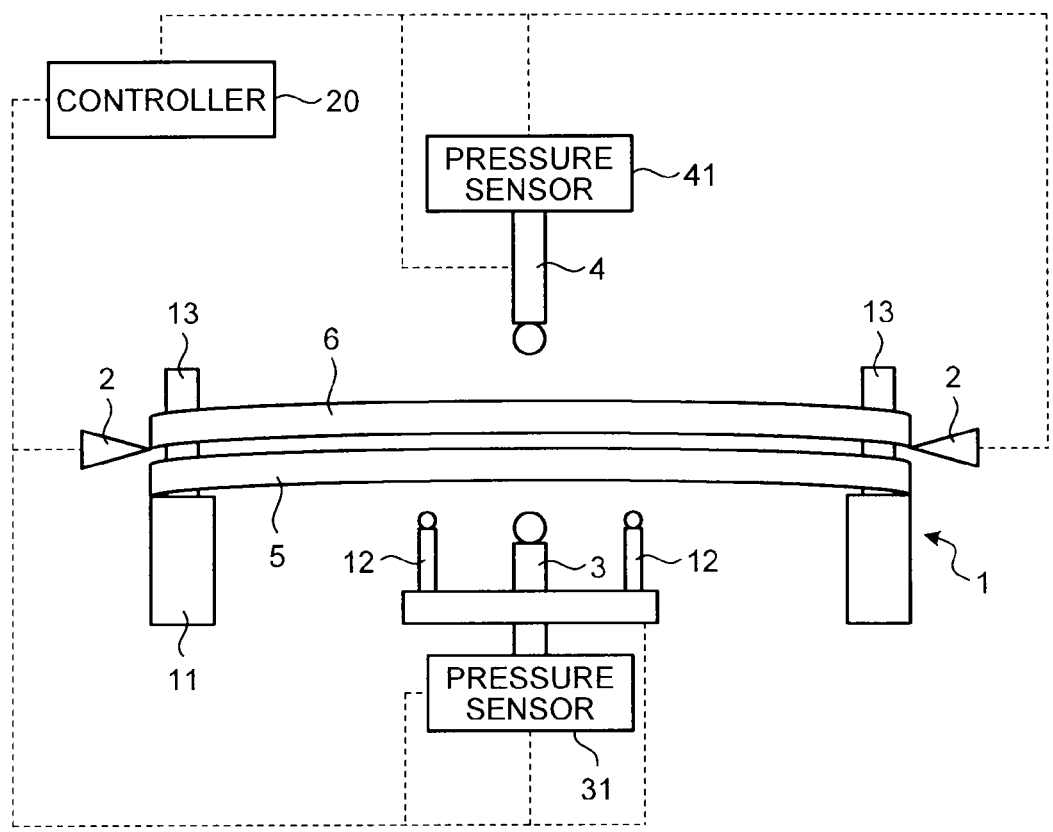
FIG. 3 is a cross-sectional view schematically illustrating another configuration of the semiconductor manufacturing apparatus according to the first embodiment where a pusher includes a pressure sensor.

FIG. 3 is a cross-sectional view schematically illustrating another configuration of the semiconductor manufacturing apparatus according to the first embodiment where a pusher includes a pressure sensor. The semiconductor manufacturing apparatus, which includes the pusher with the pressure sensor, includes the stage 1, the spacers 2, the lower pusher 3, the upper pusher 4, and the controller 20, similarly to the semiconductor manufacturing apparatus illustrated in FIG. 1A and FIG. 1B.

The stage 1 has a cylindrical or circular shape, which includes the outer periphery portions 11. The stage 1 supports the placed lower wafer 5 in contact with the outer periphery portions of the lower wafer 5 only. The stage 1 includes the pusher pins 12 configured to project above the outer periphery portions 11. The stage 1 moves down the pusher pins 12, on which the lower wafer 5 is placed when the pusher pins 12 projects above the outer periphery portions 11, thus locating the lower wafer 5 above the outer periphery portions 11. The stage 1 includes the guide pins 13 in contact with the outer periphery of the lower wafer 5. When placing the lower wafer 5 on the outer periphery portions 11, the lower wafer 5 moves down and is placed in a predetermined position being guided by the guide pins 13. The pusher pin 12 is not an essential element. The lower wafer 5 may be directly placed on the outer periphery portions 11 without the pusher pin 12.

The spacer 2 is the member that supports the outer periphery portions of the upper wafer 6, which is to be bonded with the lower wafer 5, at a plurality of areas from the lower side of the upper wafer 6, thus holding the upper wafer 6. The spacer 2 is movable in the vertical direction and adjusts a distance between the upper wafer 6 and the lower wafer 5. The spacer 2 is also movable in a radial direction of the upper wafer 6 and is retractable from between the upper wafer 6 and the lower wafer 5 after the start of bonding.

The lower pusher 3 and the upper pusher 4 are axisymmetrically disposed with respect to the normal direction of the wafer surface. The lower pusher 3 and the upper pusher 4 are each independently movable in the normal direction of the wafer. The lower pusher 3 and the upper pusher 4 respectively include a pressure sensor (first sensor) 31 and a pressure sensor (second sensor) 41. This allows to detect contact of the lower pusher 3 and the upper pusher 4 respectively with the lower wafer 5 and the upper wafer 6. The lower pusher 3 and the upper pusher 4 each have a load control function and are configured to respectively contact the lower wafer 5 and the upper wafer 6 with an arbitrary pressure. The pressure sensors 31 and 41 are not necessarily respective parts of the lower pusher 3 and the upper pusher 4, and the pressure sensors 31 and 41 may be provided individually.

The controller 20 is a device that controls movement of the pusher pins 12, the spacers 2, the lower pusher 3, and the upper pusher 4. The controller 20 controls a pressure of the lower pusher 3 applied to the lower wafer 5 and a pressure of the upper pusher 4 applied to the upper wafer 6, based on respective detection results of the pressure sensors 31 and 41.

When the semiconductor manufacturing apparatus according to this embodiment with the pushers having pressure sensors bonds two wafers, the controller 20 locates the upper wafer 6, which is held by the spacers 2, above the lower wafer 5 placed on the stage 1 such that the bonding surface of the upper wafer 6 faces to the lower wafer 5. The controller 20 locates the lower pusher 3 below the lower wafer 5 and the upper pusher 4 above the upper wafer 6 (see FIG. 2A). At this time, the lower pusher 3 and the upper pusher 4 are coaxially located with respect to the normal direction of the lower wafer 5 and the upper wafer 6. The lower pusher 3 and the upper pusher 4 are not necessarily disposed at the center of the wafer. Using the wafer with a larger warp as the lower wafer 5 among two wafers to be bonded together ensures a reduction in a local distortion of the wafer surface as described later. Although the controller 20 retracts the spacers 2 after the lower wafer 5 is overlapped with the upper wafer 6, an air layer between the wafers supports the upper wafer 6. This prevents the upper wafer 6 from contacting the lower wafer 5 at this point.

After completion of locating the lower wafer 5, the upper wafer 6, the lower pusher 3, and the upper pusher 4, the controller 20 firstly moves the lower pusher 3 toward the lower wafer 5 and detects a position of the backside surface of the lower wafer 5 with the pressure sensor 31. The controller 20 then stops the lower pusher 3 at a position where the lower wafer 5 and the upper wafer 6 are not distorted (see FIG. 2B). Next, the controller 20 moves the upper pusher 4 from the opposite direction toward the upper wafer 6 and detects contact of the backside surface of the upper wafer 6 with the pressure sensor 41. The controller 20 then applies a pressure, which does not cause a distortion of the upper wafer 6, to the wafer 6 (see FIG. 2C). This propagates the bonding front from the bonding initiation point that is sandwiched by the lower pusher 3 and the upper pusher 4, thus bonding all the surfaces of the lower wafer 5 and the upper wafer 6 (see FIG. 2D). This process allows to bond the lower wafer 5 and the upper wafer 6 together without causing a local elastic distortion of the wafer surface.

In the above description, the lower wafer 5 and the upper wafer 6 are overlapped, and the lower pusher 3 then contacts the lower wafer 5. The upper wafer 6 may be overlapped with the lower wafer 5 after the lower pusher 3 contacts the lower wafer 5.

Figure 4:
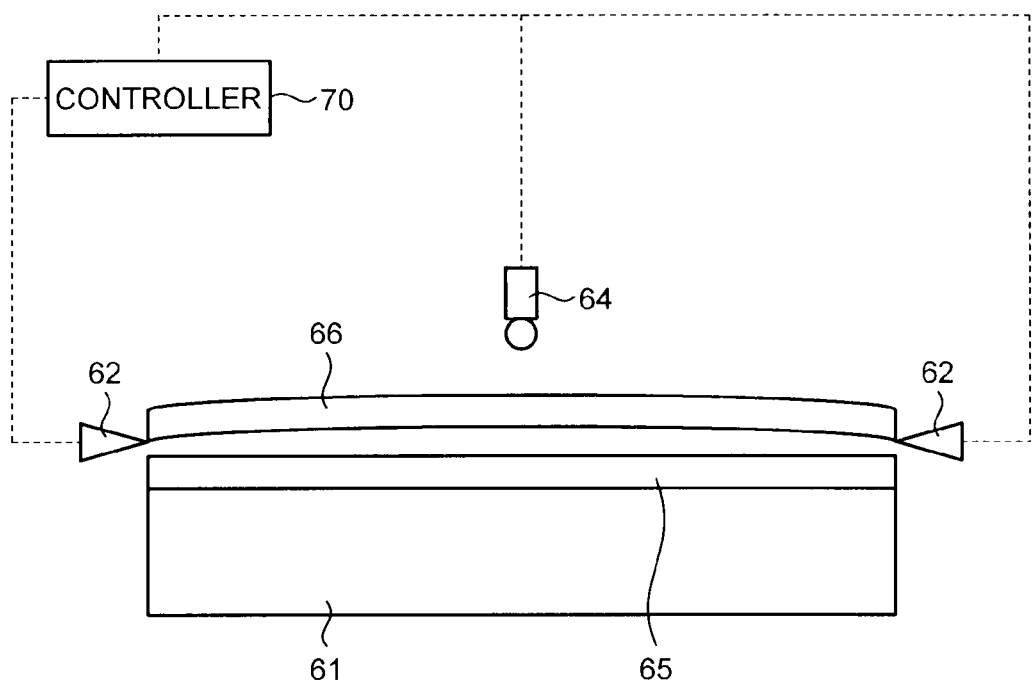
FIG. 4 is a cross-sectional view schematically illustrating a configuration of a semiconductor manufacturing apparatus that bonds wafers using a direct bonding method known by the inventors.
Figure 5A:
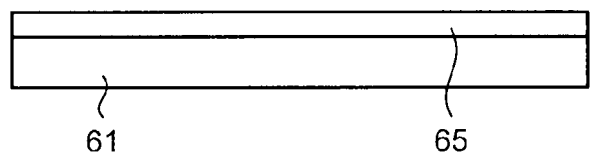
FIGS. 5A to 5D are schematic cross-sectional views illustrating a process flow of wafer bonding using the semiconductor manufacturing apparatus that uses the direct bonding method known by the inventors.
Figure 5B:
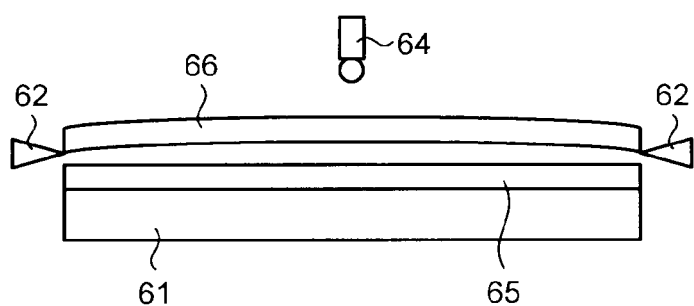
Figure 5C:
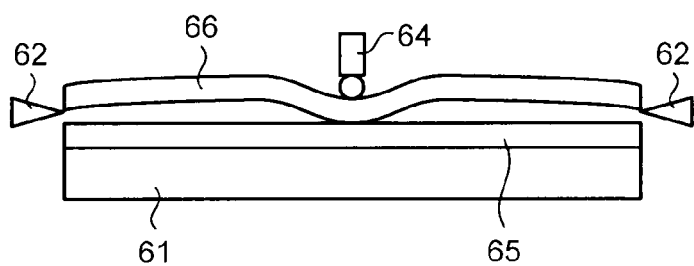
Figure 5D:
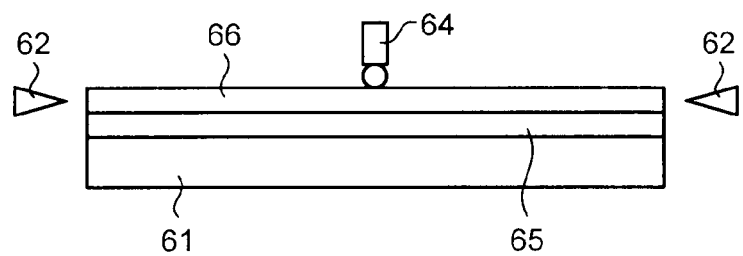
Figure 6:
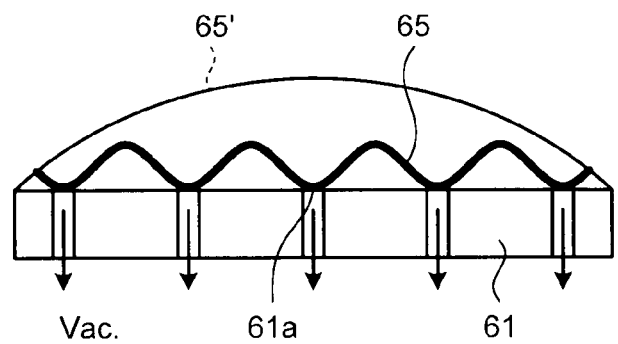
FIG. 6 is a cross-sectional view of a lower wafer schematically illustrating a change in shape of the lower wafer before and after a suction to a stage.

For purpose of comparison, a bonding process using the direct bonding method known by the inventors will be described. FIG. 4 is a cross-sectional view schematically illustrating a configuration of a semiconductor manufacturing apparatus that bonds wafers using a direct bonding method known by the inventors. FIG. 5A to FIG. 5D are schematic views illustrating a process flow of wafer bonding using the semiconductor manufacturing apparatus that uses the direct bonding method known by the inventors. A controller 70 sucks a device wafer, on which a semiconductor layer is formed, to a stage 61 as a lower wafer 65 (see FIG. 5A). FIG. 6 is a diagram schematically illustrating a change in shape of the lower wafer before and after a suction to the stage. The lower wafer 65', which is placed on the stage 61 before the suction, is attracted to the stage 61 locally with a part of a vacuum hole 61a by vacuum Vac. This causes a local distortion in the surface of the lower wafer 65 after the suction to the stage 61. Then the controller 70 moves spacers 62 and locate the upper wafer 66 as a supporting substrate above the stage 61 such that the surfaces of wafers 65 and 66 face one another (see FIG. 5B). At this time, the upper wafer 66 is held by a holding mechanism such as the spacers 62 inserted between two wafers. Thus the gap between the surface of the lower wafer 65 on the stage 61 and the surface of the upper wafer 66 is controlled by adjustment in shape and height of the spacers 62. A similar way of thinking applies to a case where a ring-shaped suction tool, which sucks the top surface of the upper wafer 66, is used as the holding mechanism instead of the spacers 62. Next, the controller 70 uses the pusher 64 to deform the upper wafer 66 by pressure at a position where the spacers 62, which hold the upper wafer 66, do not interfere. This brings the surfaces in contact and starts bonding (see FIG. 5C). Then the controller 70 retracts the spacers 62 from between the lower wafer 65 and the upper wafer 66 and promotes bonding of all the surfaces of the wafers (see FIG. 5D).

Figure 7:
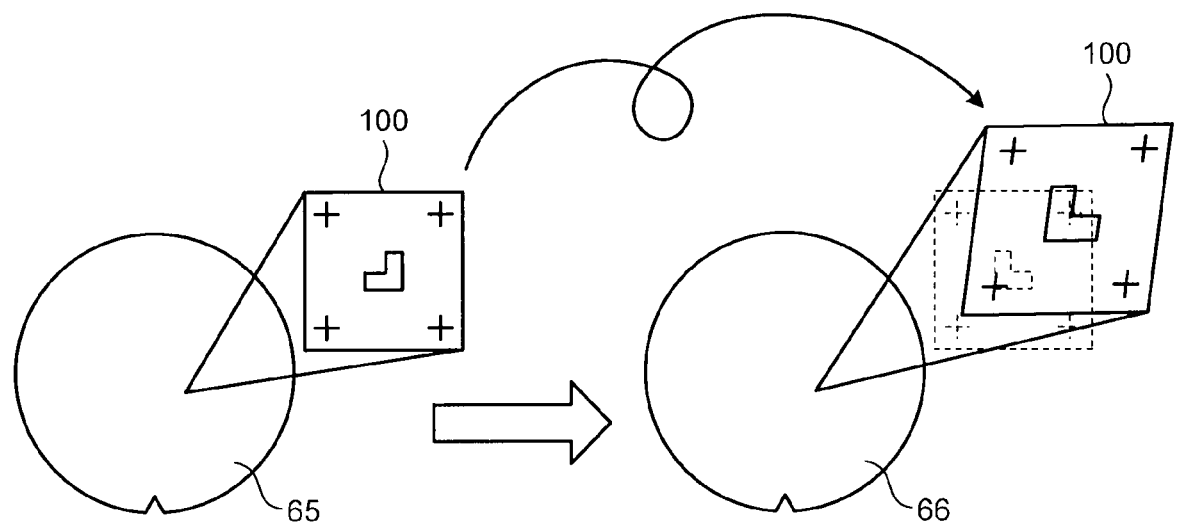
FIG. 7 is a schematic diagram illustrating shapes of patterns formed at equal intervals by a stepper on a bonded wafer where a device wafer and a supporting substrate are bonded together using the direct bonding method known by the inventors.
Figure 8:
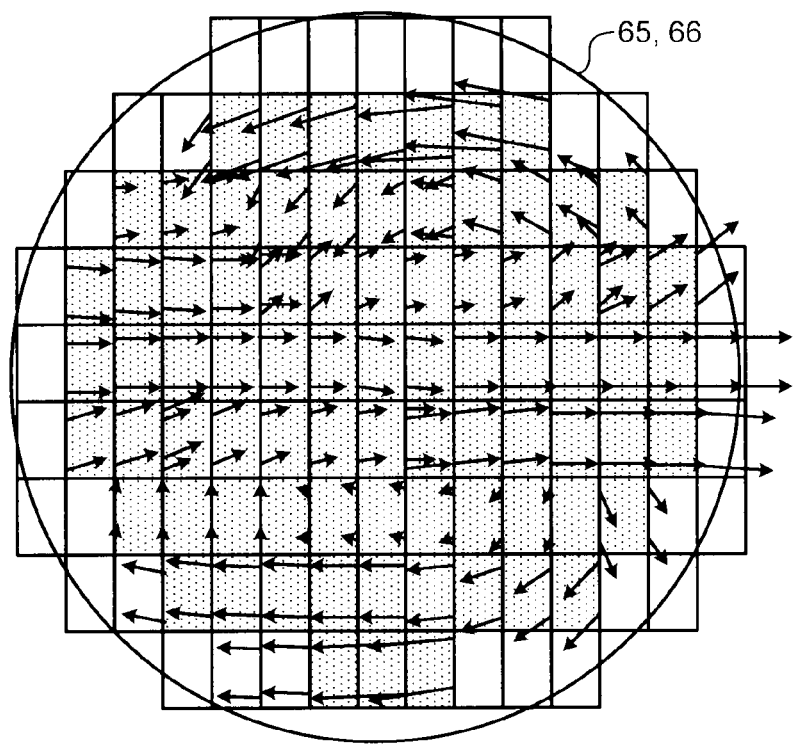
FIG. 8 is a schematic diagram illustrating an amount of position shift of the patterns formed at equal intervals by the stepper on the bonded wafer where a device wafer and a supporting substrate are bonded together using the direct bonding method known by the inventors.

FIG. 7 is a schematic diagram illustrating shapes of patterns formed at equal intervals by a stepper (reduction projection type exposure apparatus) on a bonded wafer where a device wafer and a supporting substrate are bonded together using a direct bonding method known by the inventors. Bonding the lower wafer 65 as the device wafer and the upper wafer 66 as the supporting substrate together using the direct bonding method may cause a distortion of each of a plurality of patterns (reduced patterns of patterns of a reticle) formed on the lower wafer 65 at equal intervals by the stepper and a position shift. FIG. 8 is a schematic diagram illustrating an amount of position shift of the patterns formed at equal intervals by the stepper on the bonded wafer where the lower wafer 65 as the device wafer and the upper wafer 66 as the supporting substrate are bonded together using the direct bonding method known by the inventors. FIG. 8 specifically illustrates the amount of position shift of the patterns formed at equal intervals by the stepper after removing a silicon portion of the lower wafer 65 side (that is, a stage to form a wiring layer and a color filter layer by exposure process). In FIG. 8, a longer arrow indicates a larger position shift of the patterns formed at equal intervals by the stepper. Bonding with the direct bonding method known by the inventors causes a pattern 100 with a non-uniform shape and pitch on the surface of the bonded wafer after the silicon portion of the lower wafer 65 side is removed. This shows that the device layer formed before bonding is unevenly distorted along at least the wafer surface in varied directions (distortion). In the case where this local distortion is large, this causes: a decrease in productivity such as an error handling of alignment detection in the exposure process and a need for correction; and defect of color mixture due to misalignment between the pixel of the CMOS image sensor and the color filter.

In the device wafer, the semiconductor device layer has decreased in pixel pitch (area reduction) and increased in the number of layers for high-functionality logic gate. This causes the whole wafer tends to have a larger amount of warp than that of the supporting substrate. Thickness variation among the layers causes variation in amount of warp. This makes it difficult for the stage to accommodate all the wafers even if the shape of the stage is changed into a convex or depressed shape. When the various warp caused by the multilayer structure is corrected by sucking of the stage, a local elastic distortion occurs. Further, heat generation of nearby equipment causes temperature distribution of the wafer surface. This causes local thermal expansion and thermal shrinkage. In the bonding process using the direct bonding method known by the inventors, the elastic distortion and the thermal distortion of the wafer are locally generated by a combination of the above phenomena.

In the direct bonding method known by the inventors, mounting the device wafer, which has a larger amount of warp than that of the supporting substrate, as the lower wafer 5 on the stage 1 ensures the reduced local distortion of the wafer surface.

In the case where the device layer is not locally distorted in the wafer surface as illustrated in FIG. 7 and uniformly distorted such as enlargement or shrinkage (when variation of pattern pitch is small), the exposure process is able to sufficiently match the position. This can be reflected in design size. This distortion of the wafer does not lead to the problem.

Figure 9:
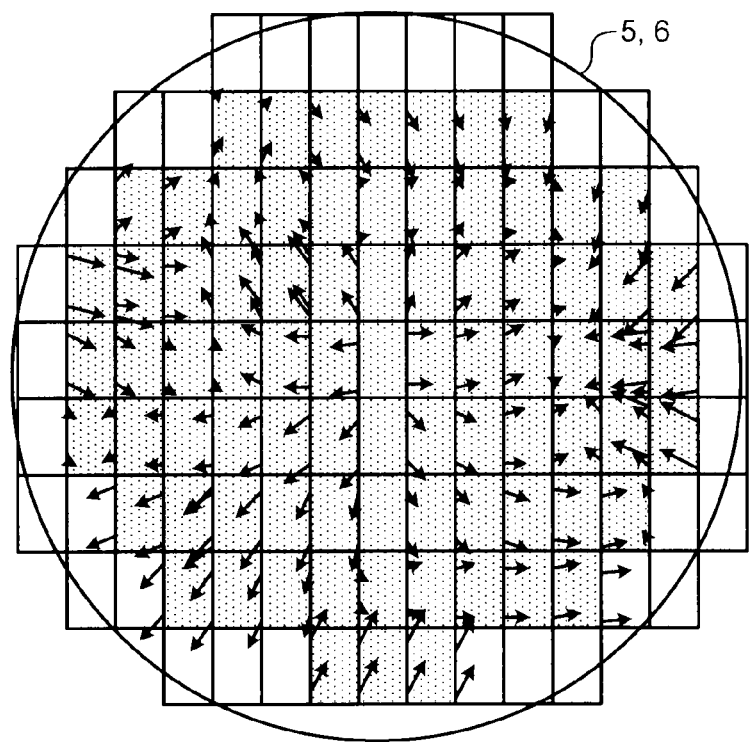
FIG. 9 is a schematic diagram illustrating an amount of position shift of the patterns formed at equal intervals by the stepper on the bonded wafer where the device wafer and the supporting substrate are bonded together using the semiconductor bonding device according to the first embodiment.

FIG. 9 is a schematic diagram illustrating an amount of position shift of the patterns formed at equal intervals by the stepper on the bonded wafer where the lower wafer 5 as the device wafer and the upper wafer 6 as the supporting substrate are bonded together with the semiconductor bonding device according to this embodiment. The semiconductor manufacturing apparatus according to this embodiment sucks the lower wafer 5 to the stage 1 so as to avoid the local elastic distortion. This reduces variation in distortion of the wafer after the bonding.

The following describes a specific example of wafer bonding using the direct bonding method with the semiconductor manufacturing apparatus including the pusher with the pressure sensor according to this embodiment. The exemplary values are one of examples, and the present invention is not limited by these values.

Figure 10:
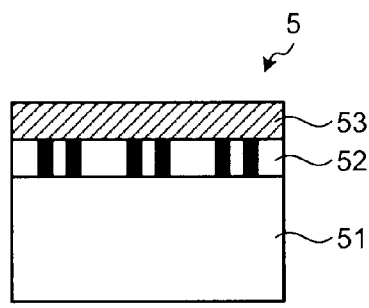
FIG. 10 is a cross-sectional view of the lower wafer.

FIG. 10 is a cross-sectional view of the lower wafer 5. The lower wafer 5 includes a single-crystal silicon substrate 51 with a diameter of 300 mm, on which a layer 52 including a mark formed in exposure process and a surface oxide film layer 53 are formed. The warp amount of the wafer is about 200 μm. The upper wafer 6 used a single-crystal silicon with a diameter of 300 mm.

The ring-shaped stage 1 has an outer diameter, which is a little bit larger than a wafer diameter. The ring-shaped stage 1 includes the guide pins 13 to match a position of the wafer to be bonded. The stage 1 also includes, on its inner side, the pusher pins 12, on which the lower wafer 5 is placed, and the lower pusher 3 movable in the vertical direction. The lower pusher 3 includes an internal load cell as the pressure sensor 31, which feeds back a measurement result for the vertical operation. An object of the mounted load cell is to detect contact between the lower wafer 5 placed on the stage and the lower pusher 3. Another possible system is a laser micrometer or a micro current sensor. The upper pusher 4, which is disposed coaxially with the lower pusher 3 above the stage 1, includes a load cell as the pressure sensor 41, similarly to the lower pusher 3. The upper pusher 4 is movable in the vertical direction and controllable in speed. The lower pusher 3 and the upper pusher 4 each included a hemispherical member with a radius of 5 mm at their respective distal ends. The radius of the distal end may be smaller insofar as a motion axis can be adjusted with high accuracy.

The lower wafer 5, on which surface physical and chemical treatments are performed, is placed on the pusher pins 12, which project above the stage 1. The lower wafer 5 is then located on the inner side of the guide pins 13 on the stage 1 by moving down the pusher pins 12. After the lower wafer 5 was placed on the outer periphery portions 11 of the stage 1, the upper wafer 6, on which surface physical and chemical treatments are performed, was placed facing the lower wafer 5. At this time, in order for the wafer surfaces not to contact one another by mistake, the spacers 2 were inserted between the upper and lower wafers, and then the upper wafer 6 was placed. The spacers 2 were then retracted.

After this, the lower pusher 3 moves up and brings the backside surface of the lower wafer 5 in contact. Then the lower pusher 3 moved down until the load of the load cell becomes equal to zero and then stopped.

Subsequently, the upper pusher 4 moved down at a speed of 0.5 mm/sec, which was a speed of the upper pusher 4 before contacting the backside surface of the upper wafer 6. After the upper pusher 4 contacted the backside surface of the upper wafer 6, pressure was then applied up to 3 N and held for about 30 sec. This completed the bonding. Considering distortion of a pressure applying portion and damage to the elements, it is preferred that lower operation speed and lower pressure-applying force of the upper pusher 4. However, if the pressure-applying force decreases to 1 N, a period from the application of the pressure to the start of bonding tends to be long. Hence the pressure-applying force was determined to be 3 N.

After removing the silicon portion of the lower wafer 5 side of the bonded wafer, a position of an exposed mark was measured. The difference between maximum and minimum pitches on the wafer surface was 108 nm.

For purpose of comparison, the lower wafer 65 was sucked to the flat stage 61. The spacers 62 were inserted, and the upper wafer 66 was then placed. Immediately after applying pressure, the spacers 62 were pulled out. The bonded wafer as bonded above is also similarly processed and measured. The difference between maximum and minimum pitches was 270 nm. The process according to this embodiment decreases in variation of the distortion to 40% of that of the direct bonding method known by the inventors.

With this embodiment, the cylindrical or circular stage simply supports the outer periphery portions of the lower wafer from the lower side, and the lower pusher contacts the lower wafer only. This reduces local distortion of the lower wafer before the bonding. This can reduce local elastic distortion of the bonded wafer that is bonded using the direct bonding method.

Second Embodiment

Figure 11:
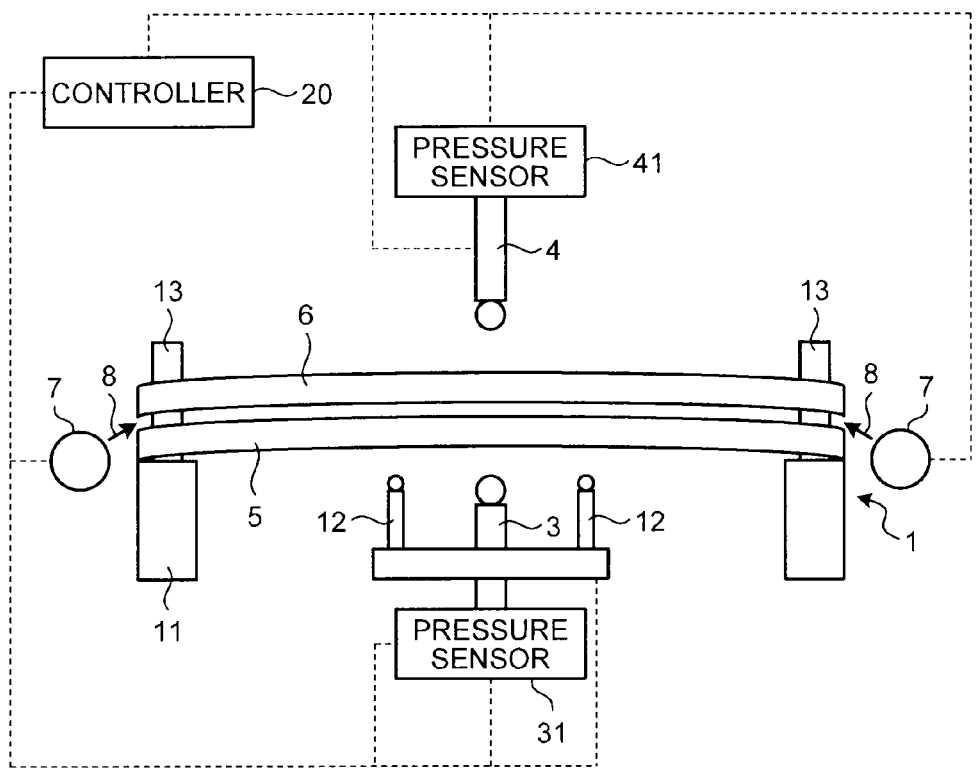
FIG. 11 is a schematic cross-sectional view schematically illustrating a configuration of a semiconductor manufacturing apparatus according to a second embodiment.

FIG. 11 is a cross-sectional view schematically illustrating a configuration of a semiconductor manufacturing apparatus according to a second embodiment. The semiconductor manufacturing apparatus according to this embodiment includes a tube 7 as a substrate supporter around the periphery of the stage. The tube 7 injects gas 8 toward the center of the stage 1. The semiconductor manufacturing apparatus is different in the above respect from the semiconductor manufacturing apparatus including the pusher with the pressure sensor according to the first embodiment. In this embodiment, the controller 20 controls flow rate, temperature, and humidity of the gas 8 injected from the tube 7.

In the bonding process using the direct bonding method known by the inventors, the upper wafer undergoes deflection and stretch by its own weight at a portion where a holding mechanism such as a spacer and a suction holding ring does not support. Similarly to the lower wafer, heat generation of nearby equipment causes temperature distribution of the wafer surface. This causes local thermal expansion and thermal shrinkage. Further, applying pressure by a contacting portion of the pusher causes local distortion. The gap between the upper and lower wafers depends on process accuracy of the jig, assembly accuracy, and parallelism of the holding mechanism such as the suction holding ring and the spacer. The surface is pulled and extended between the bonded portion and the portion to be bonded. Thus the local difference of the gap height affects on the elastic distortion.

In this embodiment, after the lower wafer 5 is placed on the stage 1, the controller 20 injects the gas 8 with the tube 7. In this state, the upper wafer 6 is placed above the lower wafer 5. This forms a thin gas layer between the upper wafer 6 and the lower wafer 5. Thus the upper wafer 6 is overlapped without contacting the lower wafer 5 while keeping a uniform gap. The flow rate of the gas 8 injected by the tube 7 is controlled by the controller 20 so as to ensure that the upper wafer 6 is overlapped above the lower wafer 5 without blowing away the upper wafer 6 or generating position shift. The gas 8 injected by the tube 7 even in low pressure is able to form the thin gas layer between the upper wafer 6 and the lower wafer 5. As a specific example, setting the pressure of the gas 8 injected by the tube 7 to equal to or less than 4 kPa, or preferably to the low pressure of equal to or less than 3 kPa allows to form the thin gas layer between the upper wafer 6 and the lower wafer 5. The above value is one of examples and the present invention is not limited by these values. In this embodiment, the humidity of the gas 8 injected by the tube 7 is controlled by the controller 20. This prevents condensation on the bonding surfaces between the upper and lower wafers and ensures the stabilized amount of adsorbed water. This further reduces temperature variation across the surfaces of the upper and lower wafers, thus reducing variation of thermal expansion (thermal distortion).

The second embodiment is otherwise similar to the first embodiment, and therefore corresponding elements will not be described. The semiconductor manufacturing apparatus having a pusher without a pressure sensor may use a tube as the substrate supporter instead of the spacer.

This embodiment reduces local elastic distortion and thermal distortion of the wafer in the bonding process.

Third Embodiment

Figure 12:
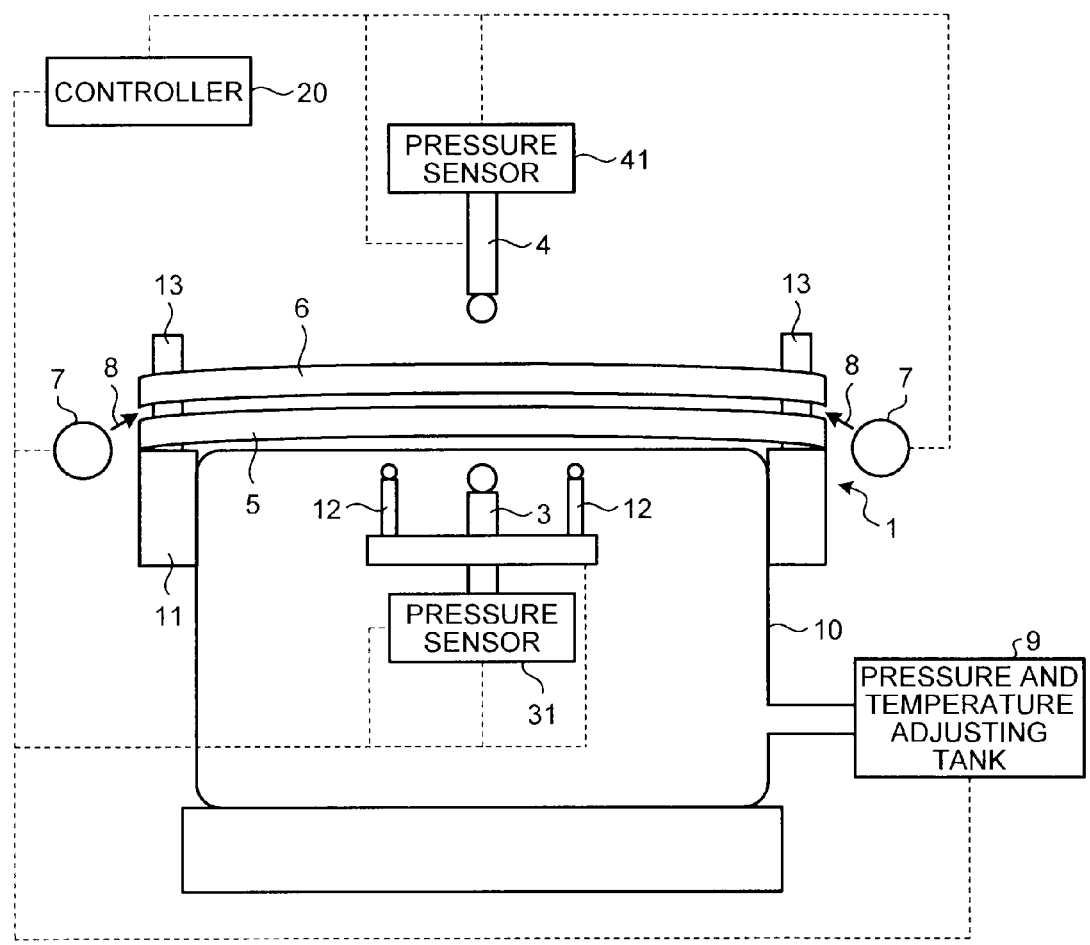
FIG. 12 is a schematic cross-sectional view schematically illustrating a configuration of a semiconductor manufacturing apparatus according to a third embodiment.

FIG. 12 is a cross-sectional view schematically illustrating a configuration of a semiconductor manufacturing apparatus according to a third embodiment. The semiconductor manufacturing apparatus according to this embodiment includes the tube 7 around the stage 1, similarly to the second embodiment. The semiconductor manufacturing apparatus according to this embodiment is different from the semiconductor manufacturing apparatus including the pushers with the pressure sensors according to the first embodiment in that the gas 8 is injected toward the center of the stage 1, and an air bag 10 is provided below the stage 1. The air bag 10 is coupled to a pressure and temperature adjusting tank (adjuster) 9. The lower pusher 3 and the pusher pins 12 are disposed in the air bag 10. The air bag 10 is made of a thin sheet that uses lightweight and flexible material. The air bag 10 may employ material such as PTFE (Polytetrafluoroethylene), HDPE (High Density Polyethylene), and Nylon 6-6. For example, the sheet used for forming the air bag 10 has a thickness of around 10 to 150 μm.

Figure 13:
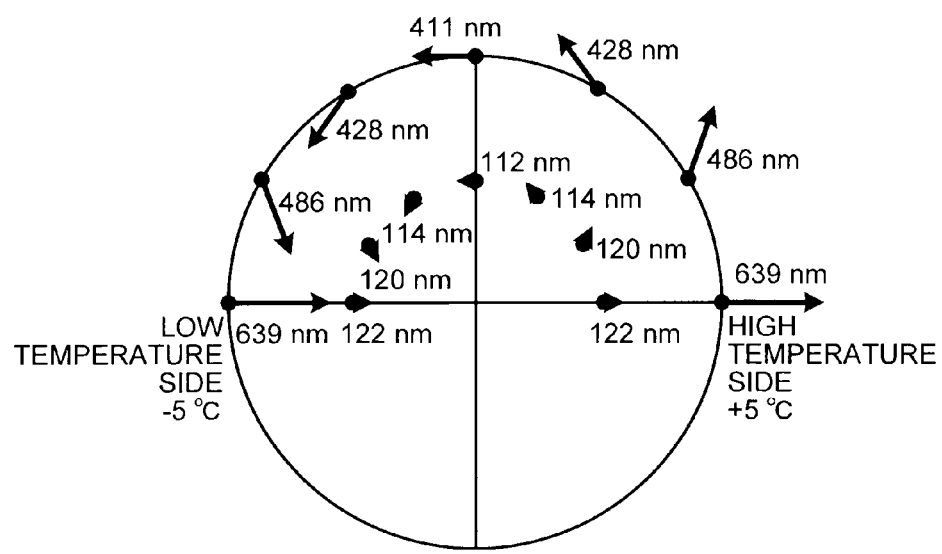
FIG. 13 is a simulation result of a distortion amount of a wafer having a temperature difference of 10° C. within the wafer surface.

The bonded wafer, which is bonded with the semiconductor manufacturing apparatus including the pusher with the pressure sensor according to the first embodiment, leaves a spiral-shaped random component in the distortion of the wafer surface. FIG. 13 is a simulation result of a distortion amount of a wafer having a temperature difference of 10° C. within the wafer surface. When there is a temperature difference of 10° C. within the wafer surface, a maximum distortion of 639 nm was estimated. Further, a measurement of temperature distribution of the lower wafer placed above the stage showed a temperature difference of up to about 2° C. across the wafer surface due to influence of a heat source such as a motor. From the simulation results, it is estimated that this temperature difference of 2° C. causes a distortion of up to 128 nm.

A specific example of the wafer bonding using the direct bonding method with the semiconductor manufacturing apparatus according to this embodiment will be described. The air bag 10, which is made of a sheet of fluorine-containing polymers with a thickness of around 20 μm, is inserted into a ring-shaped stage 1. In the air bag 10, the gas was under the adjusted conditions of temperatures of 35 to 40° C. and a pressure of room (atmosphere) air pressure plus 1.5 to 5 Pa. The gas was circulated between the air bag 10 and the pressure and temperature adjusting tank 9. The temperature and humidity of the gas, which is supplied from the pressure and temperature adjusting tank 9 to the air bag 10, is controlled by the controller 20. The gas has a higher temperature than a temperature of about 25 to 28° C. of electrical components such as a motor. The gas preferably has a temperature equal to or less than 100° C., at which hydrogen bonding is difficult to occur. The pressure of the gas is required for the air bag 10 to contact the backside surface of the lower wafer 5 in order to transfer heat to the lower wafer 5. Additionally, the pressure of the gas has an object to cancel the distortion caused by the weight of the lower wafer 5 (corresponding to distortion by applying pressure of approximately 1.8 Pa per wafer).

When the lower wafer 5 was placed above the air bag 10, the temperature difference within the wafer surface decreased to less than 0.5° C.

Further, the tube 7 with a diameter of 20 mm had injection holes with a diameter of 1 mm disposed at regular intervals. The tube 7 was installed to surround the stage 1. The tube 7 injected the gas 8 to blow a light wind. The injected gas 8 had a temperature of 35 to 40° C., a humidity of 40 to 50%, a flow rate of equal to or less than 0.01 L/min from each of the injection holes. The temperature of the gas 8 is set to be equal to or a little bit less than the temperature of the gas inside of the air bag 10. This prevents condensation on the wafer surface. The humidity of equal to or more than 30% is enough to form an adsorbed water molecule layer while the humidity of more than 70% may cause condensation.

In the semiconductor manufacturing apparatus according to this embodiment, the above-described configuration reduced not only the surface temperature of the lower wafer 5 but also temperature variation of the upper wafer 6 to less than 0.5° C.

After removing the silicon portion of the lower wafer 5 side of the bonded wafer, which is bonded using the semiconductor manufacturing apparatus according to this embodiment, a position of the exposed mark was measured. This showed the difference between maximum and minimum pitches of equal to or less than 50 nm on the wafer surface.

Accordingly, the semiconductor manufacturing apparatus according to this embodiment can decrease the distortion in variation in the wafer surface, compared with that according to the first embodiment. That is, this can reduce local elastic distortion and thermal distortion of the wafer at the bonding process.

While in the above description, an exemplary configuration circulates the gas between the pressure and temperature adjusting tank 9 and the air bag 10, liquid may be circulated between the pressure and temperature adjusting tank 9 and a bladder. That is, a configuration with a bladder filled with fluid is applicable.

This embodiment is otherwise similar to the first embodiment, and therefore duplicative descriptions will be omitted. The semiconductor manufacturing apparatus including a pusher without a pressure sensor may use a tube as the substrate supporter instead of the spacer. This semiconductor manufacturing apparatus may be implemented with the pressure and temperature adjusting tank and the air bag disposed below the stage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing apparatus configured to bond a first semiconductor substrate and a second semiconductor substrate, the bonding being formed by propagating a bond front from a bonding initiation point to the periphery, the bonding initiation point being formed by bringing bonding surfaces of the first and second semiconductor substrates in contact at a single point, the semiconductor manufacturing apparatus comprising:
a stage configured to support outer periphery portions of the first semiconductor substrate from below;
a substrate supporter configured to hold the back of the second semiconductor substrate such that the bonding surface of the second semiconductor substrate faces to the bonding surface of the first semiconductor substrate supported by the stage;
first and second pushers configured to be capable of coming into contact with the first and second semiconductor substrates, the first and second pushers being coaxially disposed with respect to a normal direction of the opposed bonding surfaces, the first and second pushers sandwiching the first and second semiconductor substrates and being disposed movably along the normal direction;
a controller configured to form the bonding initiation point between the first and second semiconductor substrates, the bonding initiation point being formed by pressing a single point of an opposite side of the bonding surface with respect to the second semiconductor substrate with the second pusher;
a bladder made of a deformable film-shaped member and disposed inside of the stage, fluid being filled inside of the bladder; and
an adjuster configured to adjust at least one of temperature and pressure of the fluid, and supply the adjusted fluid into the inside of the bladder, wherein
the bladder is configured to support a center portion of the first semiconductor substrate, the adjuster supplying the bladder with the fluid.

2. The semiconductor manufacturing apparatus according to claim 1, wherein
the fluid supplied to the inside of the bladder has a higher pressure than an air pressure of atmosphere.

3. The semiconductor manufacturing apparatus according to claim 1, wherein
the fluid supplied to the inside of the bladder has a temperature equal to or less than 100° C.

4. The semiconductor manufacturing apparatus according to claim 1, wherein
the substrate supporter is configured to inject gas toward a center of the bonding surface side of the first semiconductor supported by the stage from an outer periphery, so as to hold the back of the second semiconductor substrate.

5. The semiconductor manufacturing apparatus according to claim 4, wherein
the gas injected toward the bonding surface of the first semiconductor substrate has a temperature equal to or less than a temperature of the fluid supplied to the inside of the bladder.

6. A semiconductor manufacturing apparatus configured to bond a first semiconductor substrate and a second semiconductor substrate, the bonding being formed by propagating a bond front from a bonding initiation point to the periphery, the bonding initiation point being formed by bringing bonding surfaces of the first and second semiconductor substrates in contact at a single point, the semiconductor manufacturing apparatus comprising:
a stage configured to support outer periphery portions of the first semiconductor substrate from below;
a substrate supporter configured to hold the back of the second semiconductor substrate such that the bonding surface of the second semiconductor substrate faces to the bonding surface of the first semiconductor substrate supported by the stage;

first and second pushers configured to be capable of coming into contact with the first and second semiconductor substrates, the first and second pushers being coaxially disposed with respect to a normal direction of the opposed bonding surfaces, the first and second pushers sandwiching the first and second semiconductor substrates and being disposed movably along the normal direction;

a controller configured to form the bonding initiation point between the first and second semiconductor substrates, the bonding initiation point being formed by pressing a single point of an opposite side of the bonding surface with respect to the second semiconductor substrate with the second pusher;

a first sensor configured to detect contact of the first pusher with the first semiconductor substrate;

a second sensor configured to detect contact of the second pusher with the second semiconductor substrate;

a bladder made of a deformable film-shaped member and disposed inside of the stage, fluid being filled inside of the bladder; and an adjuster configured to adjust at least one of temperature and pressure of the fluid, and supply the adjusted fluid into the inside of the bladder, wherein the controller is configured to:
bring the first pusher in contact with a surface of an opposite side of the bonding surface with respect to the first semiconductor substrate based on a detect result of the first sensor;

then bring the second pusher in contact with a surface of an opposite side of the bonding surface with respect to the second semiconductor substrate based on a detect result of the second sensor; and then form the bond initiation point; and the bladder is configured to support a center portion of the first semiconductor substrate, the adjuster supplying the bladder with the fluid.

7. The semiconductor manufacturing apparatus according to claim 6, wherein
the fluid supplied to the inside of the bladder has a higher pressure than an air pressure of atmosphere.

8. The semiconductor manufacturing apparatus according to claim 6, wherein
the fluid supplied to the inside of the bladder has a temperature equal to or less than 100° C.

9. The semiconductor manufacturing apparatus according to claim 6, wherein
the substrate supporter is configured to inject gas toward a center of the bonding surface side of the first semiconductor supported by the stage from an outer periphery, so as to hold the back of the second semiconductor substrate.

10. The semiconductor manufacturing apparatus according to claim 9, wherein
the gas injected toward the bonding surface of the first semiconductor substrate has a temperature equal to or less than a temperature of the fluid supplied to the inside of the bladder.

* * * * *